US008453098B2

(12) United States Patent
Hossain

(10) Patent No.: US 8,453,098 B2
(45) Date of Patent: May 28, 2013

(54) SCAN CHAIN MODIFICATION FOR REDUCED LEAKAGE

(75) Inventor: Razak Hossain, San Diego, CA (US)

(73) Assignee: STMicroelectronics, Inc., Coppell, TX (US)

( * ) Notice: Subject to any disclaimer, the term of this patent is extended or adjusted under 35 U.S.C. 154(b) by 541 days.

(21) Appl. No.: 12/383,902

(22) Filed: Mar. 30, 2009

(65) Prior Publication Data
US 2009/0193307 A1    Jul. 30, 2009

Related U.S. Application Data

(62) Division of application No. 10/604,964, filed on Aug. 28, 2003, now Pat. No. 7,571,402.

(51) Int. Cl.
*G06F 17/50* (2006.01)

(52) U.S. Cl.
USPC .......................... 716/133; 716/111; 716/136

(58) Field of Classification Search
USPC ........................................ 716/111, 133, 136
See application file for complete search history.

(56) References Cited

U.S. PATENT DOCUMENTS

| 5,912,850 | A | 6/1999 | Wood et al. |
| 5,926,487 | A | 7/1999 | Chappell et al. |
| 6,539,511 | B1 * | 3/2003 | Hashizume ................. 714/727 |
| 6,946,903 | B2 | 9/2005 | Marshall et al. |
| 6,998,895 | B2 * | 2/2006 | Uvieghara ................... 327/202 |
| 7,058,834 | B2 | 6/2006 | Woods et al. |
| 7,188,286 | B2 | 3/2007 | Dervisoglu et al. |
| 7,412,637 | B2 | 8/2008 | Wang et al. |
| 2002/0162037 | A1 * | 10/2002 | Woods et al. ............... 713/322 |

OTHER PUBLICATIONS

Johnson et al.; "Models and Algorithms for Bounds on Leakage in CMOS Circuits"; IEEE Transactions on CAD design of ICs and systems; vol.18, No. 6, Jun. 1999; pp. 714-725.*
Seongmoon Wang, "Generation of Low Power Dissipation and High Fault Coverage Patterns for Scan-Based BIST", 2002 IEEE, p. 834-843.
Fadi A. Aloul, et al., "Robust SAT-Based Search Algorithm for Leakage Power Reduction", 2002, 10 pages.
Vivek De, et al., "Techniques for Leakage Power Reduction", IEEE Press, 17 pages, Publication 2001.
Afshin Abdollahi, et al., "Leakage Current Reduction in Sequential Circuits by Modifying the Scan Chains", Proceedings of the Fourth International Symposium on Quality Electronic Design, 2003 IEEE, p. 49-54.
Ranganathan Sankaralingam, et al., "Reducing Test Power During Test Using Programmable Scan Chain Disable", Proceedings of the First IEEE International Workshop on Electronic Design, Test and Applications, 2002 IEEE, p. 5 pages.
Ozgur Sinanoglu, et al., "Test Power Reduction Through Minimization of Scan Chain Transitions", Proceedings of the 20th IEEE VLSI Test Symposium, 2002 IEEE, 6 pages.

* cited by examiner

*Primary Examiner* — Naum Levin

(57) ABSTRACT

A leakage power control vector is loaded into existing test scan chain elements for application to circuit elements of a circuit in which the leakage currents are to be controlled. The vector is designed to configure the circuit elements into states in which leakage currents are reduced. A multiplexer selects the power control vector for loading into the scan chain elements, and a clock generator clocks the configuration vector into the scan chain elements. A sleep mode detector may be provided to configure the multiplexer to select the power control vector and to operate the clock generator to clock the power control vector into the scan chain elements when a sleep mode of the circuit is detected.

7 Claims, 2 Drawing Sheets

SCAN CHAIN MODIFICATION FOR REDUCED LEAKAGE

PRIORITY CLAIM

This application claims priority as a divisional of prior U.S. patent application Ser. No. 10/604,964 filed Aug. 28, 2003, now U.S. Pat. No. 7,571,402.

BACKGROUND OF INVENTION

1. Field of Invention

This invention relates to circuit improvements, and more particularly to methods and circuits for reducing leakage currents in circuits.

2. Relevant Background

A strong correlation has been shown to exist between the input vector applied to a logic cell and the leakage current through it. For example, for a 2-input static AND cell, it has been reported that the total drain to source leakage current when both the inputs are at logic 1 is 50 times greater than when the inputs are at logic 0.

As process technologies continue to scale, leakage power becomes an increasingly important part of the total power dissipation of the chip. This is as threshold voltages and gate lengths are reduced in finer geometry processes, leading to increased leakage current. In addition, with significant gate oxide scaling, leakage current starts to occur through the transistor gates. Leakage power is especially crucial in portable devices, such as cell phones, where it can directly affect the operating time before which the device needs to be recharged.

One solution that has been proposed is to determine whether a logic 1 or logic 0 value at the gate of a particular device is likely to minimize leakage of the device. Then, a vector is loaded into the latches of the circuit where leakage power dissipation is to be minimized. Thus, the latches apply a logic 1 or logic 0 value, as needed. This may be, for example, in response to a "standby" signal applied to or generated by the circuit.

As integrated circuits become increasingly complex, mechanisms for testing have been designed into the circuits. A typical testing mechanism is a "scan-chain". A scan chain typically includes a linked set of flip-flops, and usually, serially provided data is introduced into a flip-flop at one end of the chain and is clocked sequentially into the scan chain, over a number of clock cycles. The scan chain applies the test input (TI) data to various circuit elements, which produce a known output if operating correctly. If an output other than the expected known output is produced, an error in the circuit is indicated. The set of TI data that is clocked into the scan chain is often referred to as a vector, and, more particularly, is referred to herein as a test vector.

The flip-flops are configurable to accept either the test vector in a test mode or data in a normal operating mode. Thus, a test enable (TE) signal is accepted by the flip-flops of the scan chain to essentially multiplex either the test vector or the actual data for application to the circuit.

Another technique to reduce leakage power is to use large shut-off transistors which are provided to the power source. This technique requires significant layout overhead and also leads to power supply integrity issues.

SUMMARY OF INVENTION

One of the advantages realized by the invention is that by using the existing scan chain in the design, no modifications need to be made to the flip-flops or latches in the design. This means that there is no timing impact on the critical paths.

Another advantage of the invention is that no extra area or power overhead is required by having to use more complex flip-flops or latches, which were required by the prior art.

Still another advantage of the invention is that by not routing the sleep signal (also referred to as the "standby" signal) to each flip-flop, area penalties are avoided, as well as routing congestion and power dissipation in the design.

These and other objects, features and advantages of the invention will be apparent to those skilled in the art from the following detailed description of the invention, when read in conjunction with the accompanying drawings and appended claims.

The method and circuits of the invention provide a mechanism by which a set of low leakages vectors can be applied to a circuit when its inputs are not changing. The idea is that during the sleep period a set of low leakage vectors are loaded into the flip-flops of the design by using the scan chain (after which the clock signal provided to the flip-flops can be shut off.) While some extra power is dissipated in loading the low leakage signals it should be remembered that even if the sleep period lasts several seconds, it could represent many billions of clock cycles. Across so many cycles the power dissipated in loading the low leakage vectors would pale in insignificance compared to the total leakage power.

Thus, according to a broad aspect of the invention, a circuit is presented that includes scan chain elements to contain a vector for selective application to circuit elements of the circuit. A vector memory contains a configuration vector which, when applied to the circuit elements, configures the circuit elements into a state in which a leakage current is reduced. A multiplexer selects the configuration vector for loading into the scan chain elements, and a clock generator clocks the configuration vector into the scan chain elements. In one embodiment, a sleep mode detector is provided to configure the multiplexer to select the configuration vector and to operate the clock generator to clock the configuration vector into the scan chain elements when a sleep mode of the circuit is detected.

According to another broad aspect of the invention, a method is presented for reducing leakage currents in a circuit. The method includes clocking a configuration vector into scan chain elements for application to circuit elements within the circuit. The configuration vector configures the circuit elements into a state in which leakage currents are minimized. In one embodiment, the method includes detecting a sleep mode, and in response thereto performing the clocking. In another embodiment, the method also includes turning off clock pulses to the scan chain elements after the configuration vector has been applied to the circuit elements.

According to still another broad aspect of the invention, a method for reducing leakage currents in a circuit is presented. The method includes determining a vector having first states which if applied to circuit elements of the circuit results in lower leakage currents than second states, detecting an operating mode of the circuit, such as a sleep or standby mode, and clocking the vector into scan chain elements of the circuit for application thereby to the circuit elements when the operating mode is detected. In one embodiment, the method also includes turning off clock pulses to the scan chain elements after the vector has been applied to the circuit elements.

BRIEF DESCRIPTION OF DRAWINGS

The invention is illustrated in the accompanying drawing, in which.

DETAILED DESCRIPTION

Figure 1:
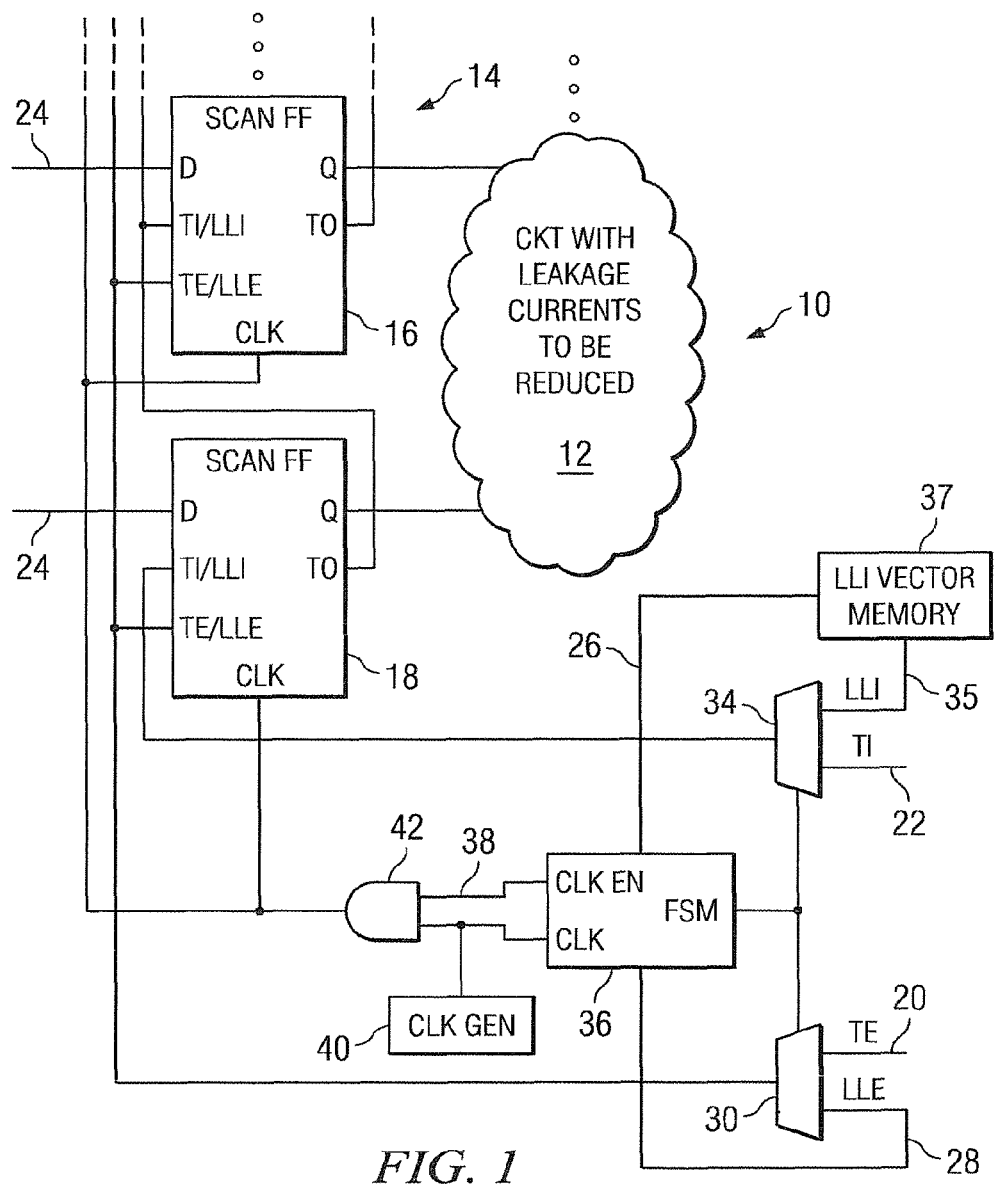
FIG. 1 is an electrical schematic diagram of a circuit having a scan chain test capability together with a leakage current reduction circuit, in accordance with a preferred embodiment of the invention.

One embodiment 10 of the invention is shown in FIG. 1, to which reference is now made. A preferred embodiment of the invention is particularly useful in conjunction with circuit or design 12 in which a scan chain test circuit 14 is already associated. In those circuits the scan-chain 14 is re-used to supply low leakage vectors to the flip-flops (not shown) of the circuit 12. That is, in addition to retaining the original test uses for the scan chain 14, the scan chain 14 is additionally used to contain a vector that reduces the leakage currents in the circuit elements of the circuit 12, in a manner below described in detail.

A typical scan chain 14 may include a large number of flip-flops; however, the scan chain shown includes only two flip-flop elements 16 and 18, for brevity, it being understood that many such flip-flop elements may be included in the scan-chain 14. The two scan-chain elements 16 and 18 shown are the same elements that would preexist in association with the circuit 12 with which the invention is employed. Typically, each flip-flop includes a D (data-in) input to which data is applied in normal operation, a TI (test-in) input to which a test vector is applied in test mode, and a TE (test-enable) input which controls the input to the flip-flop to be either the D input or the TI input. Thus, in normal testing operations, the scan-chain 14 is controlled by the TE signal 20, which controls whether the TI input 22 or standard D input 24 is loaded into each scan-chain flip-flop 16,18.

In the circuit embodiment 10 shown, when a sleep or standby mode signal occurs, the scan-chain 12 is enabled by a LLE (low leakage enable) signal 28 in place of the normal TE signal. This is implemented by a simple multiplexer 30, which receives the TI signal 20 on one input and the LLE signal 28 on another. The selection signal for the multiplexers 34 and 30, as well as the LLE signal 28, is controlled by a finite state machine (FSM) 36.

Also, according to the invention, the data inputted into the flip-flops 16 and 18 of the scan chain 14 is an LLI (low-leakage input) vector 35, instead of, the TI signal 22 that is used during scan testing. The LLI vector may be variously referred to herein as a low leakage input vector, a configuration vector, or a power control vector. This selection is also implemented with a multiplexer 34, which receives the TI signal 22 on one input and the LLI signal 35 on another.

Thus, a simple change at the input of the scan chain 14 can allow the scan chain 14 to load low leakage vectors in addition to scan testing vectors. The process of loading the low leakage vectors begins once a sleep signal is received or generated. The sleep signal may be generated, for example, in known fashion. One technique for providing the sleep signal may be, for example, on-chip, based on some time-out mechanism. Alternately, the sleep signal could be provided from off-chip sources. Those skilled in the art will recognize other sleep or standby mode signal generation techniques.

In any case, once the sleep signal is received, the LLE signal 28 is invoked for the desired scan chain elements 16,18, and the LLI vector 35 is scanned or loaded thereinto. The LLI vector 35 may be provided, for instance, from an on-chip memory device 37, from an off-chip source (not shown), or from another source. Generally, a control signal from the FSM 36 would initiate the delivery of the LLI vector 35, for example, by an enable signal on a line 26.

Figure 2:
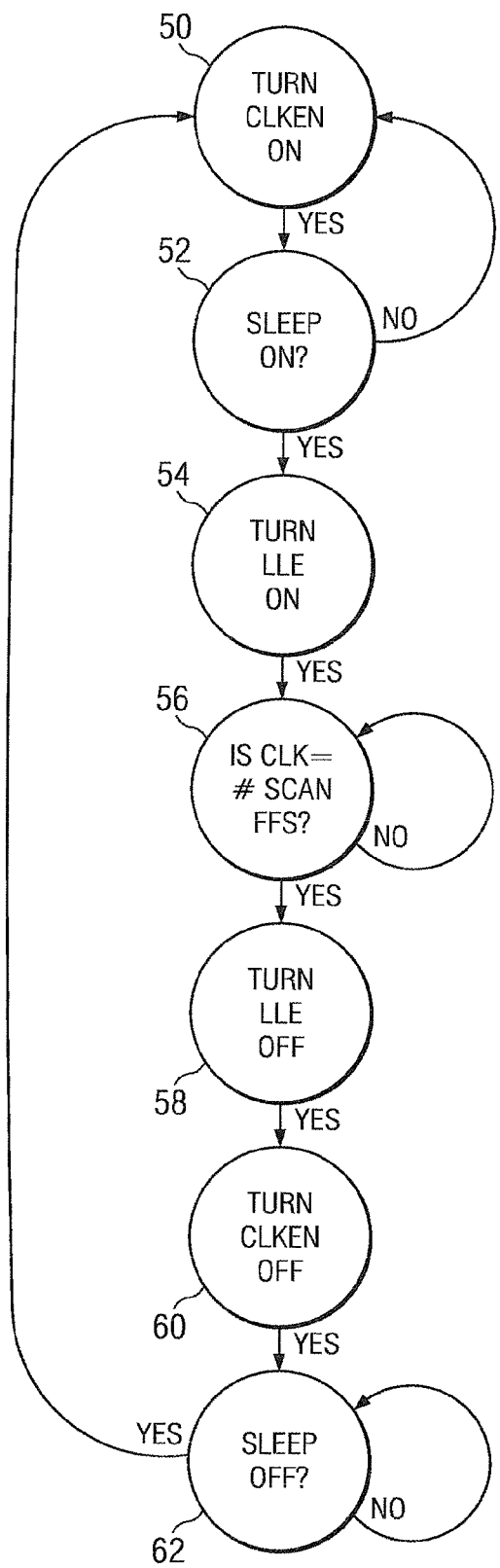
FIG. 2 is a state diagram showing an example of various states that may be assumed by a state machine in performing a method for reducing leakage currents in a circuit, in accordance with a preferred embodiment of the invention.

The FSM 36 may be used to ensure that the LLI inputs are serially available once the LLE signal 28 is turned on or selected via multiplexer 30. Various states that may be included in the finite state machine 36 are exemplified in FIG. 2, to which reference is now additionally made. The finite state machine 36 continually checks for a change of state of the sleep, or standby, mode signal, states 50 and 52, and while the circuit is not in sleep mode, allows clock signals from the clock generator 40 to apply clock pulses to the flip-flops 16,18 via clock enable signal 38 applied to AND gate 42.

Once a sleep mode is detected in state 52, the LLE signal is turned on, state 54. In order to ensure that the right vector values are placed in their corresponding scan-chain flip-flops 16,18, the LLE signal 28 must be activated for a number of cycles equal to the length of the scan chain 14 into which the LLI vectors are to be scanned. Preferably, this would include the entire scan-chain 14, but in some applications, may include a sub-set of the scan-chain.

Thus, the FSM 36 also receives (or generates) the sleep signal, and in response thereto controls the turn-on and turn-off of the LLE signal 35 by a signal on line 26. As mentioned, since different scan chain in the design are likely to have different chain lengths the FSM 36 must ensure that each scan chain will be only active for a specific number of cycles. Accordingly, the finite state machine 36 checks the number of clock pulses against the desired number of scan flip-flops into which the vector is to be clocked, state 56. After the low leakage vector, LLI, 35 has been loaded, the LLE signals for the scan chain are turned off, state 58.

In one embodiment of the invention, since there is no need to continue to clock the flip-flops 16,18 after the LLI vector 35 is loaded thereinto, the FSM controller 36 may then be used to send a clock gating signal 38 to the clock signals driving the scan chain flip-flops 16,18. In the embodiment shown, for example, the clock signals from a clock generator 40, which normally clock the flip-flops 16,18, are compared, for example, in an AND gate 42, with the normally high output 38 from the FSM 36, state 60. When the clock gating signal 38 from the FSM 36 goes low once the LLI vector 35 has been clocked into the flip-flops 16,18, the clock signals are blocked from clocking the flip-flops 16,18 further. This may be performed in state 62, in which the sleep mode is again monitored to ensure that it is still turned off. If it remains off, the flip-flops 16,18 are not clocked. This will lead to further power savings.

On the other hand, if the sleep mode is turned off, the state machine returns to state 50, removing the clock gating signal 38, allowing the flip-flops 16,18 to once again be clocked. The FSM 36 can be modified to return to state 50 (the sleep mode off state) during states 54, 56, 58 or 60 if the sleep signal is deactivated. The actual implementation will depend on the minimum length of sleep state possible. This is likely to be significantly longer than the number of clock cycles required to load the LLI vector if, for example, the PLL needs to powered up at the end of sleep.

The particular values of the LLI vector 35 that are applied to the scan chain may be pre-computed, for example based upon heuristic data or other data known about the particular devices in the circuit 12 to which they will be applied. It is assumed that a fully automated flow mechanism will be provided by which a memory to hold the LLI vectors 35 and FSM 36 will be generated once the logic is known. This is necessary as the input vectors that cause minimal leakage current are strongly dependent on the logical structure of the module.

Thus, it can be seen that the solution presented herein has at least two major advantages. First, by using the existing scan chain in the design, no modifications need to be made to the flip-flops or latches in the design. Therefore, the use of the method and circuitry of the invention will have essentially no timing impact on the critical paths. Second, there is no extra area or power overhead in having to use more complex flip-flops or latches. By not routing the sleep or standby signal to each flip-flop, the area penalty, routing congestion and power dissipation in the design are avoided.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

The invention claimed is:

1. A method for reducing leakage currents in a circuit, comprising:

providing a plurality of scan chain flip-flops coupled to circuit elements of the circuit, the scan chain flip-flops each comprising an input that alternatively configures the scan chain flip-flops in a first mode in which one or more test vectors may be loaded into the flip-flops and a second mode in which a stored vector may be loaded into the flip-flops;

determining, while the flip-flops are in the first mode, one test vector having first states which if applied to the circuit elements of said circuit results in lower leakage currents than the leakage currents of second states, the vector determined based on heuristic data associated with the circuit;

setting the one test vector to be the stored vector;

detecting an operating mode of said circuit; and clocking, while the flip-flops are in the second mode, said stored vector into scan chain elements of said circuit for application thereby to said circuit elements when said operating mode is detected.

2. The method of claim 1 wherein said detecting an operating mode comprises detecting a sleep mode.

3. The method of claim 1 further comprising turning off clock pulses to said scan chain elements after said vector has been applied to said circuit elements.

4. The method of claim 1, wherein the determining a vector comprises determining if a first state when applied to a circuit element results in lower leakage currents than a second states; the detecting comprises detecting whether said circuit is operating in either a first or a second operating mode; and the method further comprises:

clocking test data into said scan chain elements of said circuit for application thereby to said circuit elements when said second operating mode is detected.

5. The method of claim 4 wherein said detecting a first operating mode comprises detecting a sleep mode.

6. The method of claim 4 wherein said detecting a second operating mode comprises detecting a test mode.

7. The method of claim 4 further comprising turning off clock pulses to said scan chain elements after said vector has been applied to said circuit elements.

* * * * *